United States Patent [19]
Vu

[11] Patent Number: 4,590,392
[45] Date of Patent: May 20, 1986

[54] CURRENT FEEDBACK SCHOTTKY LOGIC

[75] Inventor: Tho T. Vu, Fridley, Minn.

[73] Assignee: Honeywell Inc., Minneapolis, Minn.

[21] Appl. No.: 533,715

[22] Filed: Sep. 19, 1983

[51] Int. Cl.[4] ............... H03K 19/084; H03K 19/01; H03K 19/12; H03K 3/286
[52] U.S. Cl. .................. 307/446; 307/454; 307/458; 307/291; 307/460
[58] Field of Search ............. 307/446, 454, 455, 457, 307/458, 460, 317 A, 289, 291

[56] References Cited

U.S. PATENT DOCUMENTS

| | | | |
|---|---|---|---|
| 2,901,638 | 8/1959 | Huang | 307/457 X |
| 2,950,461 | 8/1960 | Tryon | 307/457 X |
| 3,283,180 | 11/1966 | Pressman | 307/457 X |
| 3,795,822 | 3/1974 | Skokan | 307/455 |
| 4,400,635 | 8/1983 | Mazgy | 307/458 X |

Primary Examiner—Larry N. Anagnos
Attorney, Agent, or Firm—William T. Udseth

[57] ABSTRACT

A bipolar OR logic circuit includes input diodes directly connected to a switching transistor. A first current source is coupled to the transistor's emitter and a load is directly connected to and between the collector and a voltage reference point. A second current source, connected to the transistor's base, sets the switching point of the transistor. The output is taken at the collector. A second bipolar transistor can be cross coupled to the first transistor to provide a voltage reference for the base of the first transistor and/or shift the logic level by taking the output at the emitter of the second transistor.

5 Claims, 5 Drawing Figures

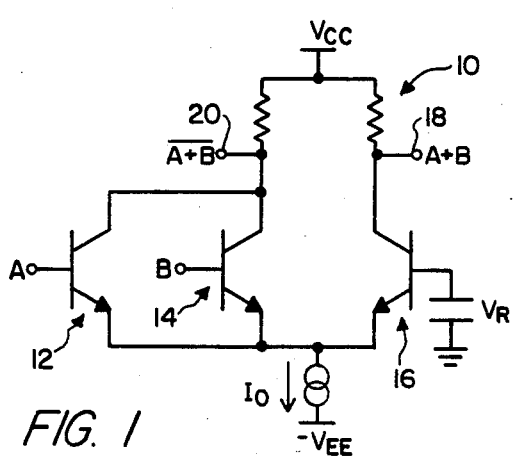
FIG. 1
CML (PRIOR ART)
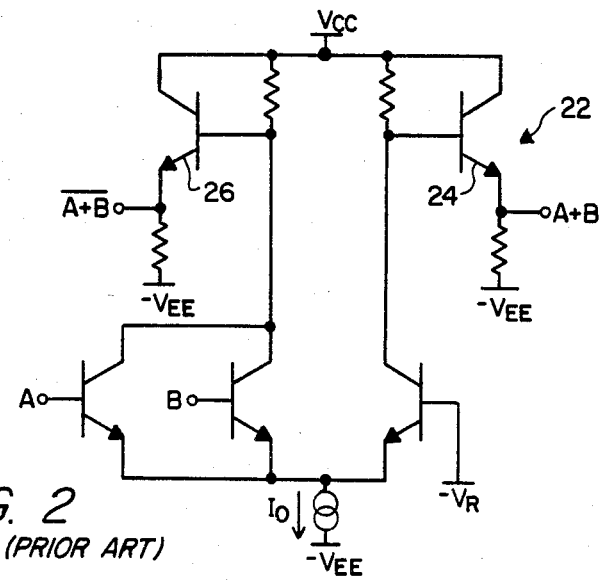
FIG. 2
ECL (PRIOR ART)
FIG. 3
FECL (PRIOR ART)
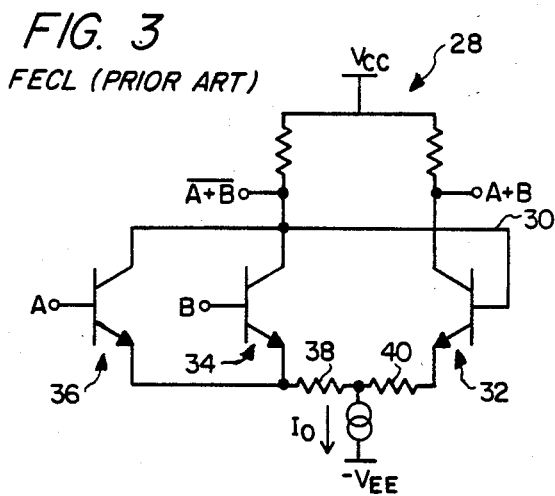
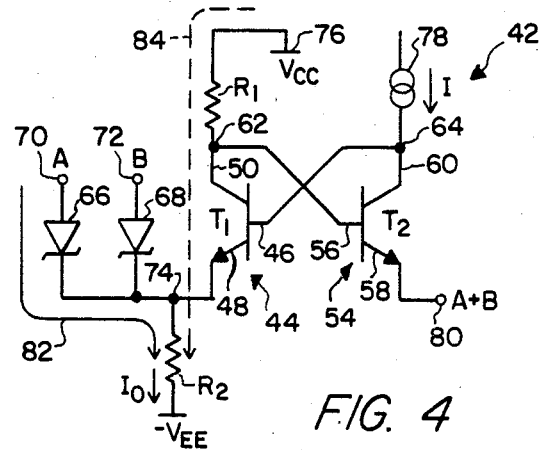
FIG. 4
CFSL - OR GATE
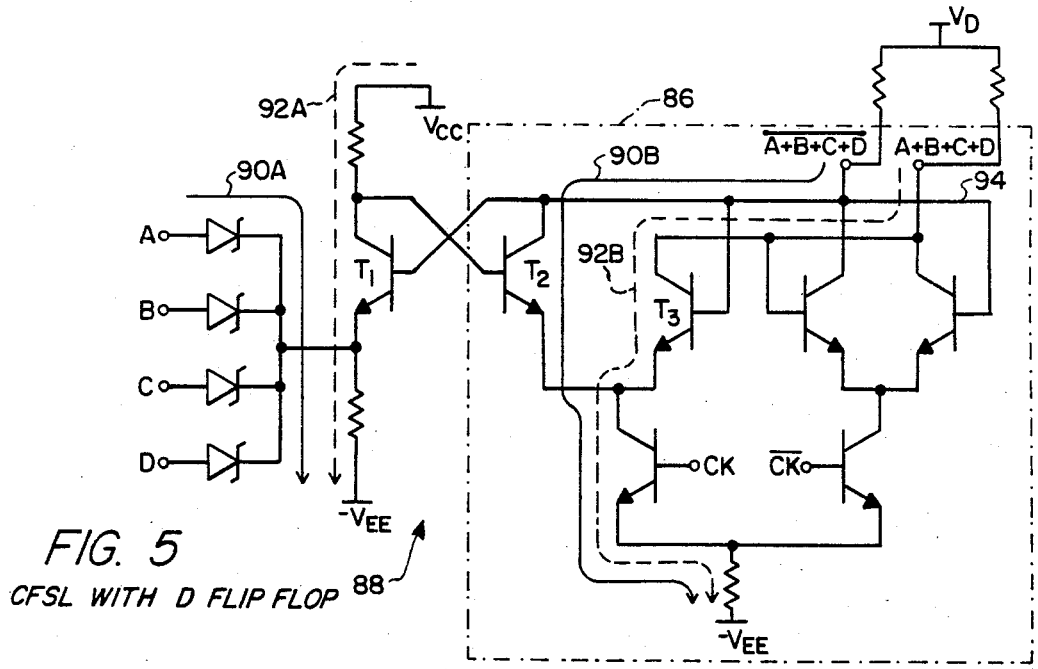
FIG. 5
CFSL WITH D FLIP FLOP

CURRENT FEEDBACK SCHOTTKY LOGIC

BACKGROUND OF THE INVENTION

1. Field of the Invention

This invention relates to nonsaturating, bipolar digital electrical logic circuits, and particularly to such circuits having a separate Schottky diode as part of the input circuit for each of several variables.

2. Prior Art

Two forms of nonsaturating digital logic in common use are current mode logic (CML, see FIG. 1) and emitter-coupled logic (ECL, see FIG. 2). Both forms of logic employ current steering approaches. FIG. 1 shows the basic CML circuit 10 including two input transistors 12 and 14 each having their emitter coupled to the emitter of transistor 16. As is well known, when the voltage to input A or B slightly exceeds the reference voltage $V_r$ input to the base of transistor 16, the current $I_H$ switches or is steered from a path through transistor 16 to a path through any input transistor (such as transistors 12 or 14) having an input voltage exceeding $V_r$. The CML circuit provides two outputs 18 and 20 with the output at 18 representing the OR logic function and outputs at 20 the complement thereof (i.e., the NOR function).

The basic ECL circuit 22 of FIG. 2 operates in essentially the same manner as the CML circuit 10 except two emitter follower transistors 24 and 26 are now provided to shift the output voltage levels of outputs 18 and 20 to facilitate logic compatibility, to provide further current gain and serve as buffers for the output signals.

FIG. 3 and circuit 28 therein illustrates a variation of ECL called feedback emitter coupled logic (FECL). FECL provides the same basic structure as CML circuit 10 except a feedback path 30 is provided from transistor 32 to transistors 34 and 36, so that the voltage gain in the transient region of the transfer function is increased by positive feedback. Emitter resistors 38 and 40, when chosen properly, reduce a strong hysteresis in the transfer function which become troublesome when circuit 28 is employed with relatively large voltage swings. Qualitatively, emitter resistors 38 and 40 reduce the loop gain thereby substantially controlling the hysteresis. The basic FECL circuit and its improved form with emitter resistors is discussed in "Improved Feedback ECL Gate with Low Delay-Power Product for the Subnanosecond Region", H. M. Reinn and R. Ranfft, IEEE Journal of Solid State Circuits, February 1977, pages 80–82.

Problems remain with all the above prior art digital logic circuits. CML and ECL include extra voltage references (i.e., $V_r$ and $-V_r$ in FIGS. 1 and 2). This reduces packing density and provides parasitic coupling between gates via a common reference source. Further, reference voltages reduce noise margins due to reference voltage tolerances. Also, CML suffers from the lack of emitter followers to help drive long metal lines (i.e., quickly charge the relatively large capacitances associated with long lines) which may be connected to the outputs, and the lack of emitter followers reduces the current gain by not providing an additional amplification stage. A major concern with CML and ECL is response delays caused by the Miller capacitance of the input transistors in common emitter configuration.

FECL eliminates the extra voltage reference (or voltage regulator) but lacks emitter followers, and the logic inputs are still provided through transistors in common emitter configuration.

SUMMARY OF THE INVENTION

The present invention is a digital electrical circuit comprising: a first bipolar transistor having a first emitter, first base and first collector; a second bipolar transistor having a second emitter, second base and second collector wherein the second collector is directly electrically connected to the first base and the first collector is directly electrically connected to the second base; and a unidirectional current conducting means directly electrically connected to the first emitter. A plurality of unidirectional current conducting means, each directly connected to the first emitter and each having an input, allows the circuit to perform an OR logic function for multiple variables. The output could be taken at the first collector but is preferably taken from the second emitter. The second bipolar transistor is preferably included and provides a voltage reference for the first transistor as well as a convenient voltage level shifting means.

BRIEF DESCRIPTION OF THE DRAWINGS

FIG. 1 is an electrical circuit schematic of prior art current mode logic (CML).

FIG. 2 is an electrical schematic of prior art emitter coupled logic (ECL).

FIG. 3 is an electrical schematic of prior art feedback emitter coupled logic (FECL).

FIG. 4 is an electrical schematic of the basic circuit of the present invention, current feedback Schottky logic (CFSL).

FIG. 5 is an electrical schematic of CFSL in combination with a D flip flop.

DESCRIPTION OF THE PREFERRED EMBODIMENT

Digital circuit 42 (see FIG. 4) includes a first bipolar transistor 44 ($T_1$), having first base 46, first emitter 48 and first collector 50, and a second bipolar transistor 54 ($T_2$), having a second base 56, second emitter 58 and second collector 60. First base 46 is directly electrically connected to second collector 60 at node 64, and second base 56 is directly electrically connected to first collector 50 at node 62. Unidirectional current conducting means (such as Schottky diodes 66 and 68, note that "current" herein means conventional current) directly electrically connect logic inputs 70 and 72 (i.e., A and B), respectively, to first emitter 48 at node 74.

Resistor $R_1$ is preferably provided between node 62 and a voltage reference point 76 (e.g., $V_{cc}$ or ground). Resistor $R_2$ is preferably provided between node 74 and a voltage supply $-V_{EE}$. Node 64 is directly electically connected to current source 78. The output 80 of circuit 42 is preferably extracted from the second emitter 58.

In operation circuit 42 functions as a current steering digital logic circuit. Depending upon the input values, current is passed either through one or more of the Schottky diodes 66 or 68 (see solid line 82), or through transistor 44 (see dashed line 84).

For purposes of illustration, assume that $T_1$ is on, i.e., current is flowing along path 84 and Schottky diodes 66 and 68 are not conducting. This condition will be referred to as the "on" state of circuit 42. In the on state, the emitter 48 junction of $T_1$ is forward biased. Current source 78 provides substantially constant current through $T_2$ and serves as part of a reference voltage source to base 46. In the example of FIG. 4, $T_1$ is an n-p-n transistor, therefore for circuit 42 to be on, the voltage of base 46 must exceed the voltage at node 74 by at least the barrier height of the emitter 48 junction of $T_1$. Furthermore, for Schottky diodes 66 and 68 to be nonconducting, each must be reverse biased. Therefore the inputs A and B must be a low voltage relative to the metallized side of Schottky diode 66 and 68. Low inputs are defined as a logic 0. With $T_1$ on, current $I_o$ is drawn along path 84 providing a voltage drop across resistor $R_1$ and resulting in a low voltage at node 62. Thus, when circuit 42 is on, the logic inputs at A and B are each zero and the logic condition at collector 50 and node 62 is 0.

If either Schottky diode 66 or 68 is forward biased, i.e., the logic input at A or B is 1, such a diode will conduct. As with CML, circuit 42 is designed so that input voltages sufficient to forward bias diodes 66 or 68, are also sufficient to reverse bias the emitter 48 junction of $T_1$, (i.e., the voltage on input A or B less the voltage drop across diode 66 or 68 is larger than the voltage applied to the base of $T_1$). With $T_1$ off, the current $I_o$ will be directed almost entirely through one or more of Schottky diodes 66 or 68. The current $I_o$ is thus steered from path 84 to path 82 by selection of the appropriate input voltage. When the current $I_o$ is traveling along path 82, the voltage at node 62 is raised relative to the voltage at node 62 when the current $I_o$ is traveling along path 84.

Thus if the logic signal input into either logic input A or B is a logic 1, the logic condition at node 62 will be a logic 1. Circuit 42 therefore performs an OR logic function with the inputs being inputs A and B and the output being taken at node 62. Circuit 42 is completed by providing emitter follower $T_2$ so that the output at node 62 is the input to $T_2$. $T_2$ serves to shift the voltage level of the output of node 62 by the barrier height of the emitter 58 junction of $T_2$, but reproduces the OR logic function at output node 80.

The basic CFSL circuit 42 has been shown by way of example. The number of inputs may be any number (i.e., one or more) depending only on circuit design limitations or desires. CFSL can of course be implemented in positive or negative logic. The basic OR gate of FIG. 4 can be readily adapted to construct other logic operations including, but not limited to, AND, NOR and NAND.

Circuit 42 has eliminated the reference voltage of CML and ECL, as well as Miller capacitance effects due to the input transistors of CML, ECL and FECL. Increased speed of operation occurs in CFSL over these prior forms of logic due not only to elimination of the Miller capacitance of input transistors, but also due to the inherent reduction in delay propogation afforded by Schottky diodes as compared to the p-n junctions within the input transistors. This inherent speed advantage is due to the fact that Schottky diodes are majority carrier devices with low majority carrier storage time whereas p-n junctions are primarily minority carrier devices with relatively large minority carrier storage times.

The use of emitter follower $T_2$ affords an extra stage of current gain over CML and enhances CFSL's ability to drive long lines. Circuit 42 provides good transfer characteristics and therefore good noise immunity. CFSL has a very low power-delay product combined with high packing density.

FIG. 5 shows CFSL incorporated with a D-type flip flop (laying within dot-dashed line 86) in circuit 88. Circuit 88 is merely one possible application of CFSL. In this example, CFSL provides both OR and NOR logic functions for inputs A, B, C and D, as well as the storing of data using a complementary clock (i.e., CK and $\overline{CK}$) approach. Here the clock lines are ANDed with the data by series gating.

Similar structure between circuit 42 and 88 are numbered the same for clarity. Current flows in circuit 88 as shown by solid line 90a and 90b or dashed line 92a and 92b, with the particular path and direction depending on the input conditions and the choice of positive or negative logic. CFSL serves as a differential current switch in circuit 88 to provide current gain and steer a preset control current from another stage (not shown) into flip flop 86. In circuit 88, feedback line 94 is used to supply the reference voltage to the base of $T_1$ and $T_3$.

What is claimed is:
1. An electrical circuit, comprising:
a first bipolar transistor having a first emitter, first base and first collector;
a second bipolar transistor having a second emitter, second base and second collector, wherein said second collector is directly electrically connected to said first base and said first collector is directly electrically connected to said second base;
a first current source connected to said first emitter;
a load means connected to and between said first collector and a voltage reference point;
a second current source connected to said second collector; and
a unidirectional current conducting means directly electrically connected to said first emitter, wherein electrical signals can be input to said unidirectional current conducting means and an output taken at said second emitter.

2. The device of claim 1 wherein said unidirectional current conducting means is a Schottky diode capable of allowing current input to said diode to flow through said diode toward said first emitter.

3. The circuit of claim 1 further including a plurality of unidirectional current conducting means, each directly electrically connected to said first emitter.

4. The circuit of claim 3 further including an input for each of said unidirectional current conducting means, and wherein each of said unidirectional current conducting means is capable of passing electrical current from said input thereto toward said first emitter, so that said circuit can perform an OR logic function with respect to said inputs, with the OR logic function being said second emitter.

5. A digital electrical logic circuit, comprising:
a first bipolar transistor having a first emitter, a first base and a first collector;
a second bipolar transistor having a second emitter, second base and a second collector, wherein said second collector is directly electrically connected to said first base and said first collector is directly electrically connected to said second base;
a plurality of unidirectional current conducting means, each directly electrically connected to said first emitter and each having an input;
a load means directly connected to and between the collector of said first transistor and a voltage reference point;
a first current source directly electrically connected to said first emitter; and
a second current source directly electrically connected to said second collector, so that said current can perform an OR logic function with respect to said inputs with the OR logic function output being said second emitter.

* * * * *

UNITED STATES PATENT AND TRADEMARK OFFICE
CERTIFICATE OF CORRECTION

PATENT NO. : 4,590,392
DATED : MAY 20, 1986
INVENTOR(S) : THO T. VU

It is certified that error appears in the above-identified patent and that said Letters Patent is hereby corrected as shown below:

Column 4, line 64, delete "current" and insert in lieu thereof --circuit--.

Signed and Sealed this

Twenty-fifth Day of November, 1986

Attest:

DONALD J. QUIGG

*Attesting Officer*     *Commissioner of Patents and Trademarks*